United States Patent
Kawaguchi et al.

(10) Patent No.: US 6,518,735 B2
(45) Date of Patent: Feb. 11, 2003

(54) METHOD AND APPARATUS FOR MEASURING PURE RESISTANCE OF IN-VEHICLE BATTERY

(75) Inventors: Tomohiro Kawaguchi, Shizuoka (JP); Norihito Enomoto, Shizuoka (JP); Hideaki Kamohara, Shizuoka (JP); Youichi Arai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/985,525

(22) Filed: Nov. 5, 2001

(65) Prior Publication Data

US 2002/0053910 A1 May 9, 2002

(30) Foreign Application Priority Data

Nov. 7, 2000 (JP) .......................................... 2000-339416
Dec. 15, 2000 (JP) .......................................... 2000-382716
Feb. 22, 2001 (JP) .......................................... 2001-046856

(51) Int. Cl.$^7$ ........................ G01N 27/416; G01R 31/02
(52) U.S. Cl. ........................................ 320/430; 324/416
(58) Field of Search ................................. 324/430, 426, 324/433, 416

(56) References Cited

U.S. PATENT DOCUMENTS 5,721,688 A * 2/1998 Bramwell .................... 320/128

* cited by examiner

Primary Examiner—Gregory J. Toatley, Jr.
(74) Attorney, Agent, or Firm—Armstrong, Westerman & Hattori, LLP

(57) ABSTRACT

In an apparatus for measuring a pure resistance of an in-vehicle battery, a terminal voltage and a discharging current of the battery are measured when the discharging current flows from the battery. A first approximate equation of a voltage-current characteristic curve is acquired for an increasing discharging current, and a second approximate equation is the voltage-current characteristic curve is acquired for a decreasing discharging current. Two points providing equal synthesized resistances each composed of the pure resistance and polarization resistance component are set on the voltage-current characteristic curves represented by the first and the second approximate equations, respectively. The gradients between the two points in each of the voltage-current characteristic curves are corrected to provide two corrected gradients each exclusive of a voltage drop due to the polarization resistance component. The two corrected gradients are averaged to provide an average value which is measured as a pure resistance of the battery.

10 Claims, 12 Drawing Sheets

$y=0.000051x^2-0.018176x+11.852744$

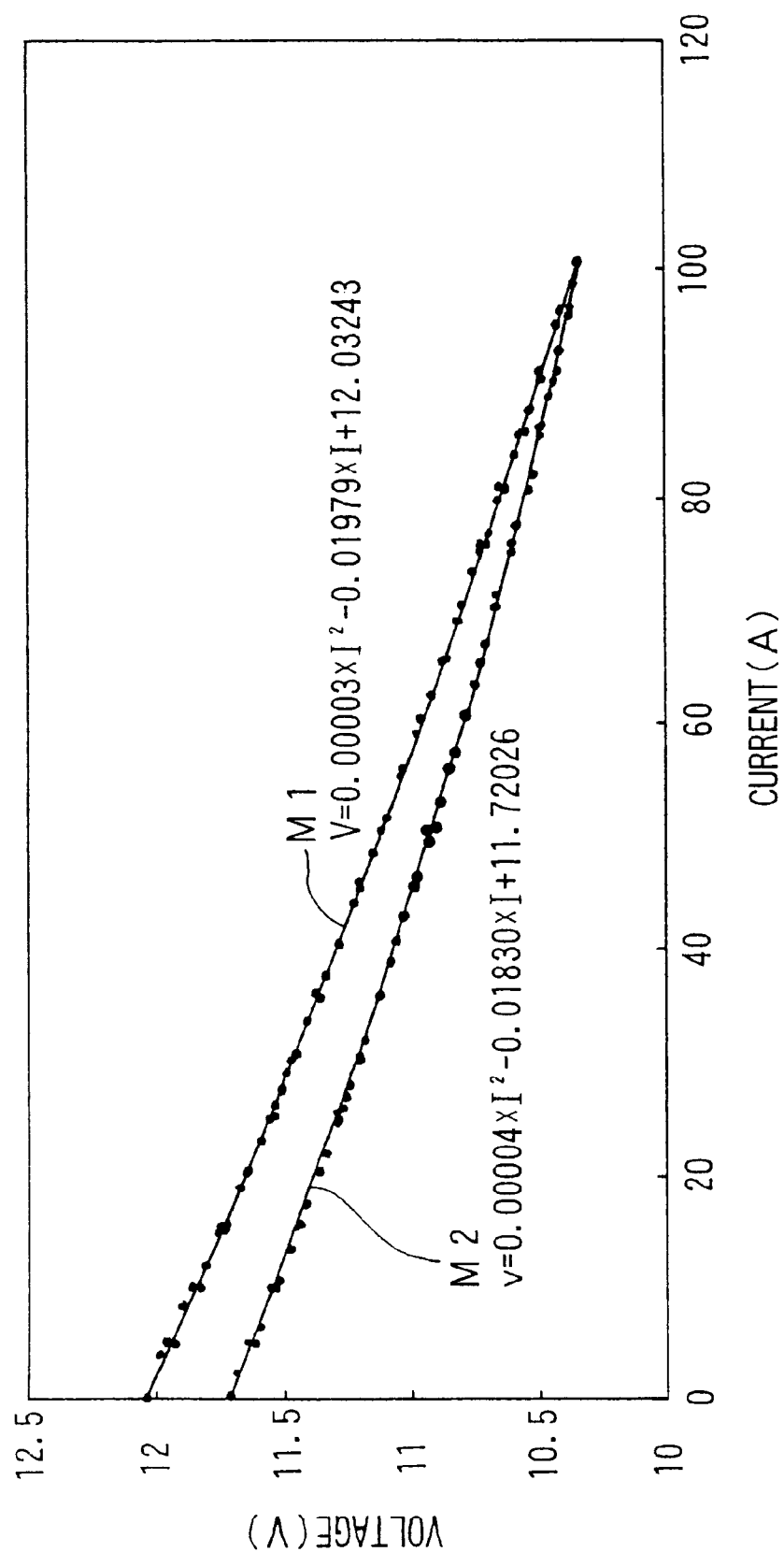

METHOD AND APPARATUS FOR MEASURING PURE RESISTANCE OF IN-VEHICLE BATTERY

BACKGROUND OF THE INVENTION

1. Field of the Invention

This invention relates to a method and apparatus for measuring the pure resistance of an in-vehicle battery mounted to supply electric power to a load in the vehicle.

2. Description of the Related Art

Generally, when a current is discharged from a battery, a drop in a terminal voltage of the battery occurs. The voltage drop, which is ascribable to the internal impedance (synthesized resistance) of the battery, consists of an IR loss (voltage drop due to pure resistance, i.e. ohmic resistance) due to the structure of the battery and a polarization resistance component (voltage drop due to activating polarization and concentration polarization). In the voltage-current (V-I) characteristic, the voltage drop ascribable to the IR loss does not vary as long as the battery maintains the same state, whereas the voltage drop ascribable to the polarization resistance component varies according to the value of the current and the time while the current flows. Therefore, if the various states of the battery are estimated from the V-I characteristic containing the polarization resistance component, an inaccurate result is estimated. This requires a technique of measuring only the pure resistance separated from the polarization resistance component.

The battery can be used repeatedly within a range of a charging capacitance by charging the battery so that the discharging current is compensated for. However, where an unexpected accident such as excessive discharging or shortage of electrolyte occurs, or a secular change of the battery occurs owing to the usage of for a long time, the dischargeable capacitance, which is electric energy that can be supplied to a load, falls abruptly. Therefore, in the state where dischargeable capacitance has fallen owing to the secular change, even when the discharging which exceeds the charging is generated for a very short time, there is a fear that an engine cannot be started again by energization of a starter motor after it has been stopped.

Additionally, in comparison between a new battery and that having suffered from the secular change, it is known that the latter has a larger resistance than the former. Therefore, in the routine inspection of a vehicle, it was proposed to measure the pure resistance as a standard of battery exchange. This is because knowing the pure resistance permits the degree of degradation to be determined taking the proportion of the pure resistance to the polarization resistance component. Knowing the degree of degradation can be also used to estimate the open circuit voltage of the battery.

Traditionally, the measuring apparatus that has been used to measure the pure resistance of the battery measures it when the battery is in a stationary state, or in an equilibrium state where there is no voltage rise or fall in the electrolyte owing to the polarization of the charging/discharging.

One example of this technique is to acquire the pure resistance from the relationship between the voltage and current that varies within a prescribed time of e.g. about 1 $\mu$sec. in a state where either polarization due to charging or discharging is not accumulated by repeating the charging/discharging by application of the AC voltage at the frequency of 1 kHz–100 kHz to the battery. This uses the phenomenon as shown in FIG. 14 that after the discharging has been stopped, the voltage restores abruptly and thereafter restores gently. Now, it is assumed that the abrupt restoration within a prescribed time $\Delta t$ is attributable to the pure resistance R and the subsequent gentle restoration is attributable to the other component (capacitance and inductance component) such as polarization exclusive of the pure resistance. On this assumption, the pure resistance is measured on the basis of the voltage and current within a short period during each application cycle of the AC at 1 kHz–100 kHz.

However, the battery mounted in a vehicle is stationary in only a limited case. Therefore, the above technique cannot be adopted while the vehicle is running.

In the above method, in order to collect the data of the voltage V and current I in a short time, the data sampling with a very short period and the subsequent A/D conversion within a prescribed time $\Delta t$ are required. The above method has an advantage that it can be realized in a single measuring apparatus. However, it is difficult to implement the method in a vehicle. In addition, in order to acquire the $\Delta V/\Delta I$ with great accuracy, the large values of $\Delta V$ and $\Delta I$ must be given. However, these large values can be measured in only a limited case in the vehicle. Further, any optional AC voltage cannot be applied to the battery while the vehicle is running. Accordingly, actually, the method described above cannot be realized to measure the pure resistance of the battery while the vehicle is running.

SUMMARY OF THE INVENTION

An object of this invention is to provide a method and apparatus for measuring the pure resistance of an in-vehicle battery which can measure the pure resistance while a vehicle is running.

In accordance with the first aspect of this invention is to provided a method for measuring a pure resistance of an in-vehicle battery which supplies electric power to a load of the vehicle comprising the steps of:

periodically measuring a terminal voltage and a discharging current of the battery when the discharging current, which increases monotonously to exceed a prescribed value and decreases monotonously from the maximum value to the prescribed value or lower, flows, thereby acquiring a first approximate equation of a voltage-current characteristic curve, indicative of correlation between the terminal voltage and the discharging current, for an increasing discharging current and a second approximate equation of the voltage-current characteristic for a decreasing discharging current;

setting a first point on the voltage-current characteristic curve represented by the first approximate equation and a second point on the voltage-current characteristic curve represent by the second approximate equation;

assuming a first assumed point and a second assumed point on the voltage-current curves represented by the first approximate equation and the second approximate equation, the first assumed point providing the same resistance as a second synthesized resistance composed of a pure resistance of the battery and a second polarization resistance component, which produces a second voltage drop when a second discharging current corresponding to the second point flows, and the second assumed point providing the same resistance as a first synthesized resistance composed of the pure resistance of the battery and a first polarization resistance component, which produces a first voltage drop when a first discharging current corresponding to the first point flows;

acquiring a first corrected gradient exclusive of a voltage drop due to the second polarization resistance component and a second corrected gradient exclusive of a voltage drop due to the first polarization resistance component, the first corrected gradient being acquired by correcting a first gradient of a first line connecting the second point and the first assumed point is corrected by a difference between the voltage drops due to the second polarization resistance component, which are produced by the second discharging current and the discharging current at the first assumed point, and the second corrected gradient being acquired by correcting a second gradient of a second line connecting the first point and the second assumed point by a difference between the voltage drops due to the first polarization resistance component, which are produced by the first discharging current and the discharging current at the second assumed point; and acquiring an average gradient of the first corrected gradient and the second corrected gradient by averaging a sum of them so that the average gradient is measured as the pure resistance of the battery.

In this method, the terminal voltage and discharging current and discharging current are measured when electric power is supplied to a load in a normal using state of vehicle, and the data thus obtained have only to be processed to acquire the pure resistance of the battery.

Preferably, in this method, the first point and the second point are located on the voltage-current characteristic curves represented by the first approximate equation and second approximate equation within a range where there are terminal voltage and the discharging current measured to acquire these equations.

In this method, at least one data for acquiring the gradient is based on real data so that using point which is greatly deviated from point actually measured is avoided.

Preferably, the first point and the second point on the are located on the voltage-current characteristic curves represented by the first approximate equation and second approximate equation at a point corresponding to the maximum value of the discharging current of the battery measured to acquire these approximate equations.

In this configuration, at least one data for acquiring the gradient is based on real data so that using point which is greatly deviated from point actually measured is avoided. In addition, both points are set at the common points so that inclusion of an error can be suppressed.

Preferably, the first approximate equation and the approximate equation are quadratics. This permits the approximate equations more similar to the real data to be applied to acquire the gradients.

Preferably, newer sets of the terminal voltages and the discharging currents for a prescribed time are stored for collection in a memory. In this method, after it has been confirmed that the discharging current necessary acquire the first and second approximate equations has flowed, the first and second approximate equations can be acquired using the real data stored.

In accordance with the second aspect of this invention, the apparatus corresponding to the first aspect is provided, thereby giving the same effect. Namely, as shown in FIG. 1, there is provided an apparatus for measuring a pure resistance of an in-vehicle battery which supplies electric power to a load of the vehicle comprising:

means 23a-1 for periodically measuring a terminal voltage and a discharging current of the battery when the discharging current, which increases monotonously to exceed a prescribed value and decreases monotonously from the maximum value to the prescribed value or lower, flows;

means 23a-2 for acquiring a first approximate equation of a voltage-current characteristic curve, indicative of correlation between the terminal voltage and the discharging current, for an increasing discharging current and a second approximate equation of the voltage-current characteristic for a decreasing discharging current; and means 23a-3 for setting a first point on the voltage-current characteristic curve represented by the first approximate equation and a second point on the voltage-current characteristic curve represent by the second approximate equation, assuming a first assumed point and a second assumed point on the voltage-current curves represented by the first approximate equation and the second approximate equation, the first assumed point providing the same resistance as a second synthesized resistance composed of a pure resistance of the battery and a second polarization resistance component, which produces a second voltage drop when a second discharging current corresponding to the second point flows, and the second assumed point providing the same resistance as a first synthesized resistance composed of the pure resistance of the battery and a first polarization resistance component, which produces a first voltage drop when a first discharging current corresponding to the first point flows, acquiring a first corrected gradient exclusive of a voltage drop due to the second polarization resistance component and a second corrected gradient exclusive of a voltage drop due to the first polarization resistance component, the first corrected gradient being acquired by correcting a first gradient of a first line connecting the second point and the first assumed point is corrected by a difference between the voltage drops due to the second polarization resistance component, which are produced by the second discharging current and the discharging current at the first assumed point, and the second corrected gradient being acquired by correcting a second gradient of a second line connecting the first point and the second assumed point by a difference between the voltage drops due to the first polarization resistance component, which are produced by the first discharging current and the discharging current at the second assumed point, and acquiring an average gradient of the first corrected gradient and the second corrected gradient by averaging a sum of them so that the average gradient is measured as the pure resistance of the battery.

In this apparatus, the terminal voltage and discharging current and discharging current are measured when electric power is supplied to a load in a normal using state of vehicle, and the data thus obtained have only to be processed to acquire the pure resistance of the battery.

Preferably, in this apparatus, the first point and the second point are located on the voltage-current characteristic curves represented by the first approximate equation and second approximate equation within a range where there are terminal voltage and the discharging current measured to acquire these equations.

In this apparatus, at least one data for acquiring the gradient is based on real data so that using point which is greatly deviated from point actually measured is avoided.

Preferably, in the apparatus, the first point and the second point on the are located on the voltage-current characteristic curves represented by the first approximate equation and second approximate equation at a point corresponding to the maximum value of the discharging current of the battery measured to acquire these approximate equations.

In this apparatus, at least one data for acquiring the gradient is based on real data so that using point which is greatly deviated from point actually measured is avoided. In addition, both points are set at the common points so that inclusion of an error can be suppressed.

Preferably, in the apparatus, the first approximate equation and the approximate equation are quadratics. This permits the approximate equations more similar to the real data to be applied to acquire the gradients.

Preferably, newer sets of the terminal voltages and the discharging currents for a prescribed time are stored for collection in a memory. In this apparatus, after it has been confirmed that the discharging current necessary acquire the first and second approximate equations has flowed, the first and second approximate equations can be acquired using the real data stored.

The above and other objects and features of this invention will be more apparent from the following description taken in conjunction with the accompanying drawings.

BRIEF DESCRIPTION OF THE DRAWINGS

FIG. 6 is a graph showing examples of the approximate characteristic curves represented by two quadratic approximate equations;

DESCRIPTION OF THE PREFERRED EMBODIMENTS

Figure 1:
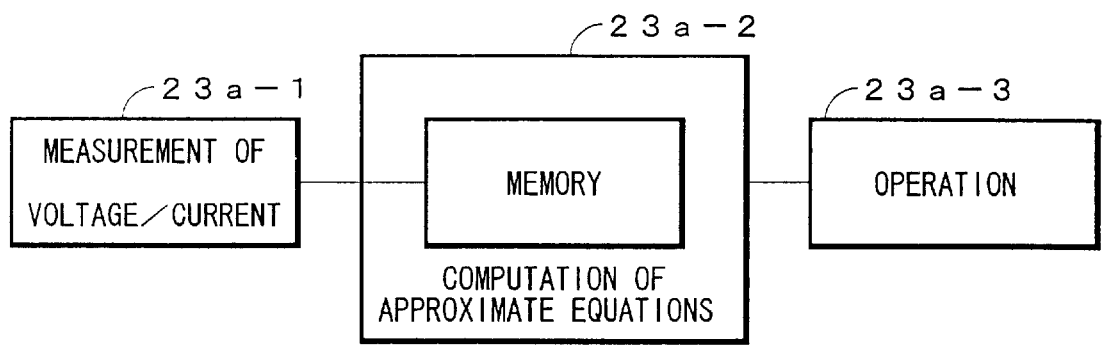
FIG. 1 is a block diagram showing a basic arrangement of an apparatus for measuring the pure resistance of an in-vehicle battery according to this invention.

Now referring to the drawings, an explanation will be given of a method for measuring the pure resistance of an in-vehicle battery as well as an apparatus therefore. Prior to this, an explanation will be given of the characteristic itself.

Figure 3:
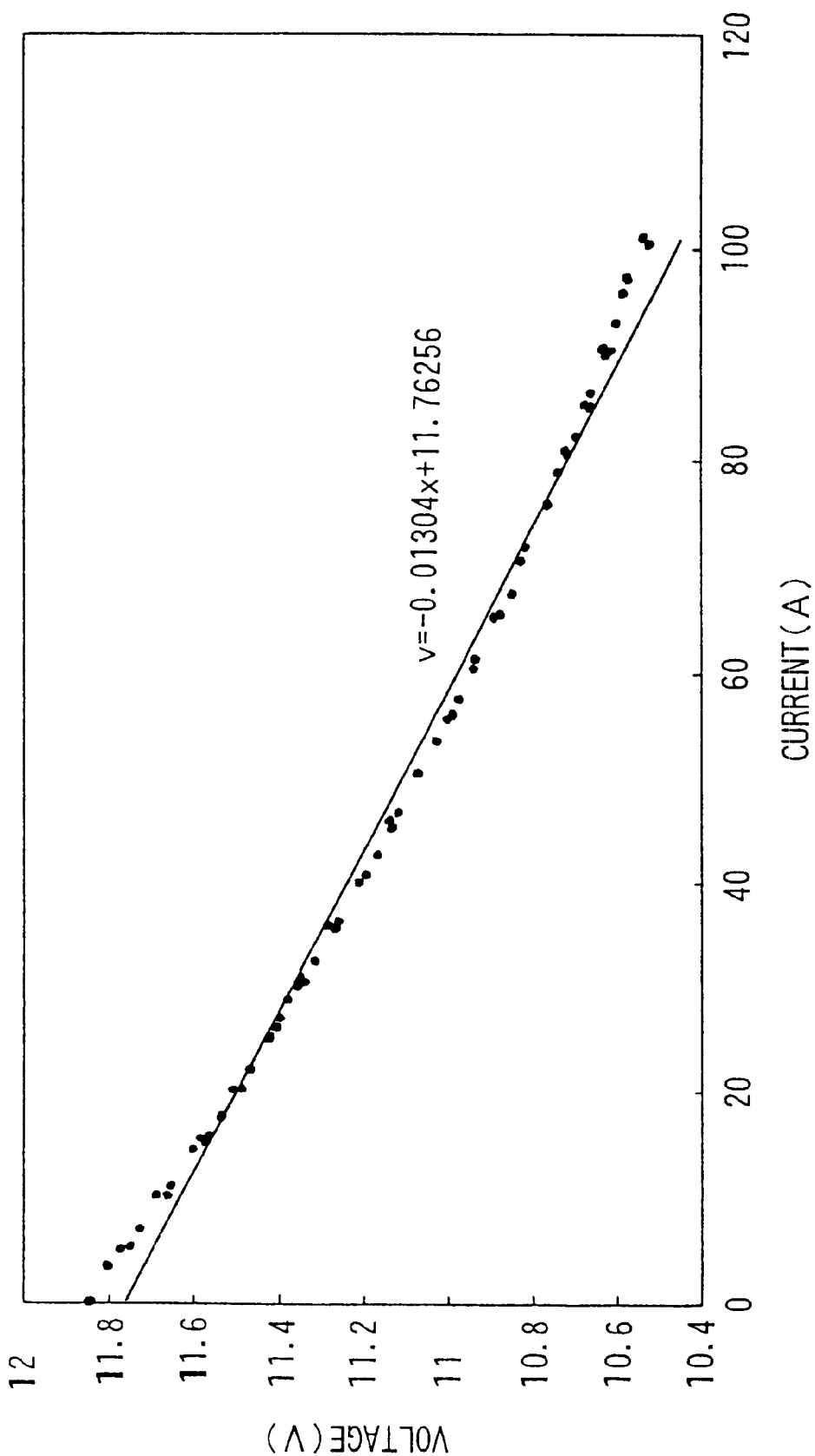
FIG. 3 is a graph showing an example of the V-I characteristic represented by a linear approximate equation.
Figure 4:
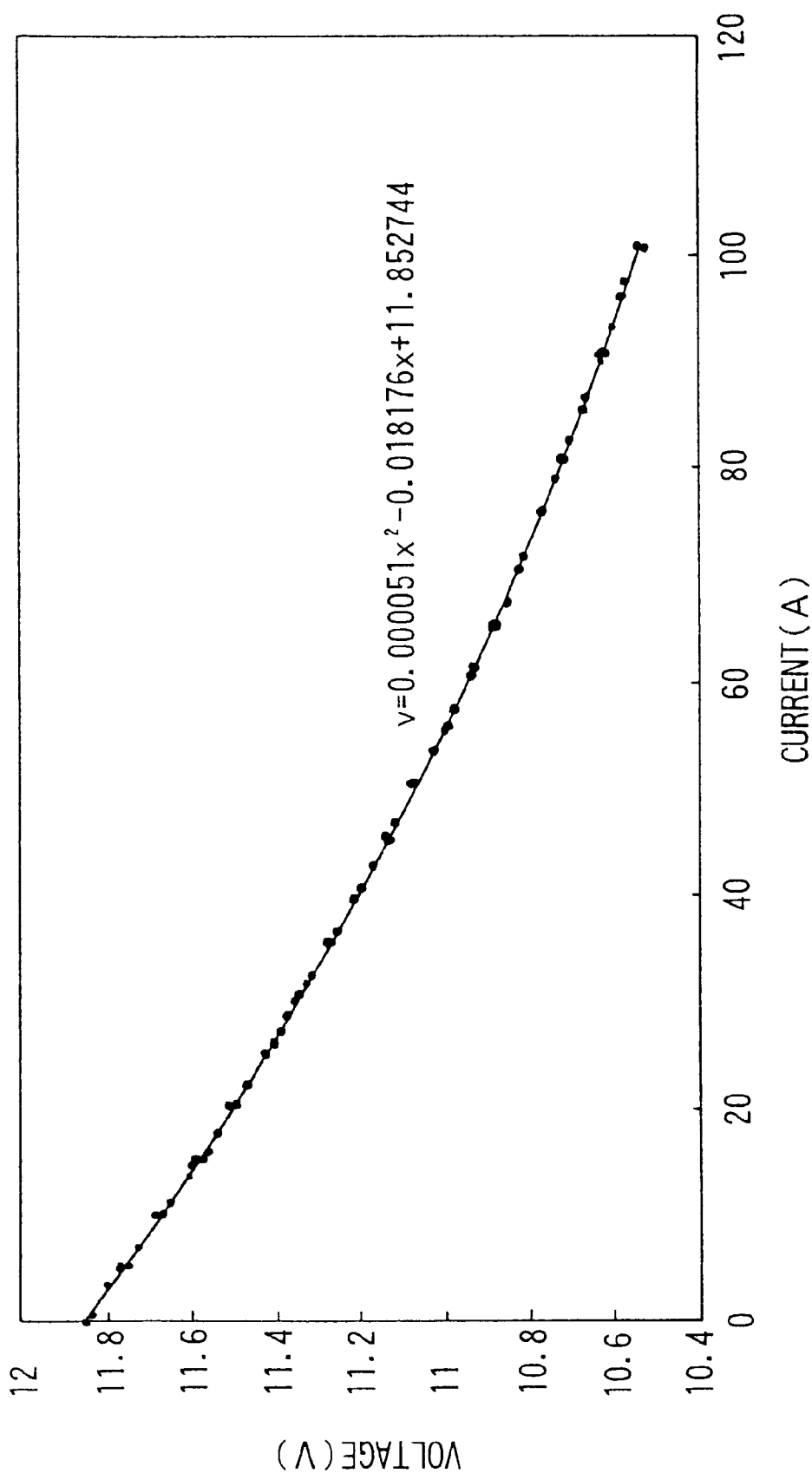
FIG. 4 is a graph showing an example of the V-I characteristic represented by a quadratic approximate equation.

Meanwhile, a 12 V vehicle, an 42 V vehicle, an EV vehicle or an HEV vehicle incorporates the load requiring a large current which requires a large current, such as a starter motor, a motor generator, a running motor, etc., examples of the voltage-current (V-I) characteristic of a battery for supplying the electric power to these loads are shown in FIGS. 3 and 4.

Figure 5:
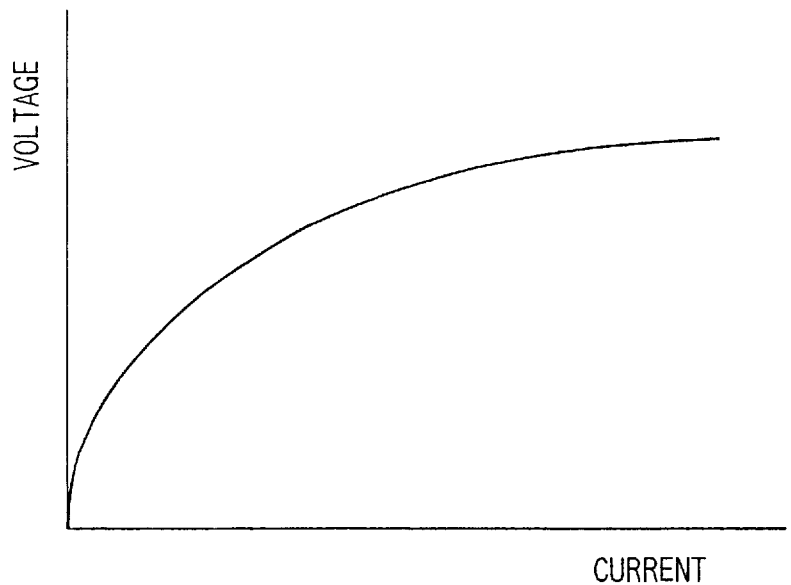
FIG. 5 is a graph showing an example of a change in the polarization for a current.
Figure 14:
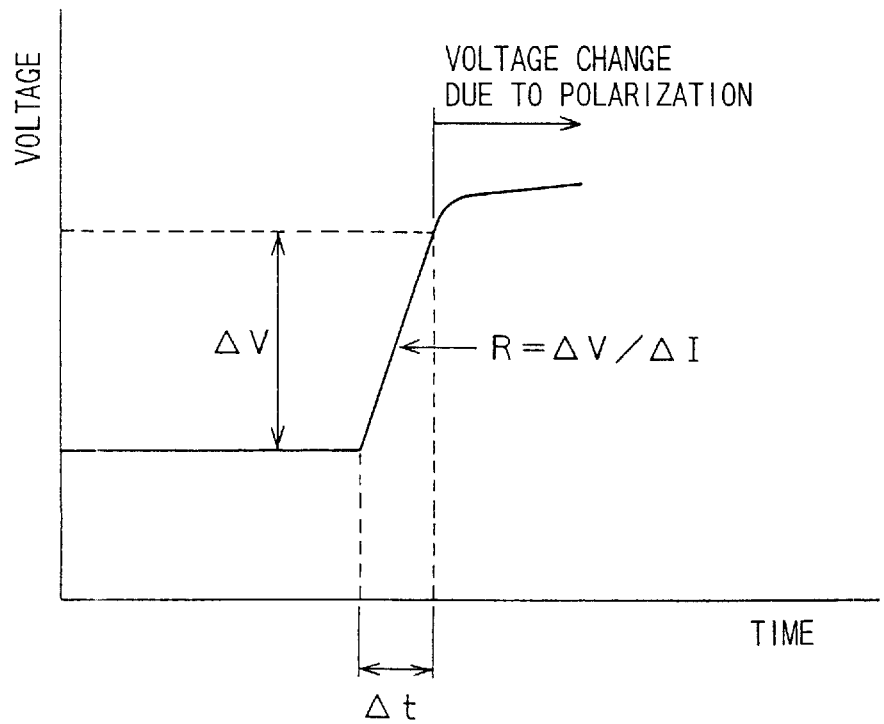
FIG. 14 is a graph for explaining a conventional manner of measuring the pure resistance of a battery.

The V-I characteristic of the battery can be approximated by a linear equation: $V=aI+b$. However, in this embodiment, considering the influence of the characteristic of non-linearity of the polarization component as shown in FIG. 5, a quadratic approximate equation with high correlation: $V=aI^2+bI+c$ is used. This equation can be obtained by the least-squares method.

While the load which requires a large current is driven, a discharging current flowing when the battery is discharged once increases monotonously to exceed a prescribed value and decreases monotonously from the maximum value to the prescribed value or lower. The discharging current and the terminal voltage of the battery at this time are measured periodically to acquire the real data indicative of the correlation between the terminal voltage and discharging current. On the basis of the data, as shown from the graph of FIG. 6, characteristic curves (hereinafter also referred to as approximate curves) are represented by two approximate equations M1 and M2. The first approximate equation M1 represents the V-I characteristic for an increasing discharging current which increases, after the discharging has been started, to reach a maximum value and the V-I characteristic for a decreasing current which decreases from the maximum value. The Equation described in FIG. 6 is an example of a concrete approximate equation obtained by the real data. The difference between these two approximate equations M1 and M2 will be analyzed.

In the case of the first approximate equation M1, using, as a standard, the polarization resistance component at the start of discharging, when the current increases after the discharging has been started, the polarization resistance component increases gradually. When the current reaches the maximum value, the polarization resistance component reaches the peak. Thereafter, the polarization is gradually dissolved with a decrease in the current. However, actually, the polarization resistance component is not dissolved in proportion to a decrease in the current, but the reaction is delayed. Therefore, in the approximate equation M2, the same V-I characteristic as when the current increases is not exhibited, but a larger voltage drop is generated. Thus, two approximate equations M1 and M2 corresponding to when the voltage increases and when it decreases are acquired.

Now referring to FIGS. 7 to 9, an explanation will be given of the method of measuring the pure resistance of a battery using two approximate curve equations M1 and M2 of the above V-I characteristic.

First, a point A is set within a range of the real data on the approximate curve represented by M1. A voltage drop $\Delta V1$ from intercept C1 of the approximate curve M1 for the ordinate of the graph of FIG. 6 to point A is acquired. The value when the $\Delta V1$ is divided by the current I1 at point A is a combined resistance that is a sum of the pure resistance R and the polarization resistance component Rpol 1. Namely, $$R+Rpol1=\Delta V1/I1$$

Figure 7:
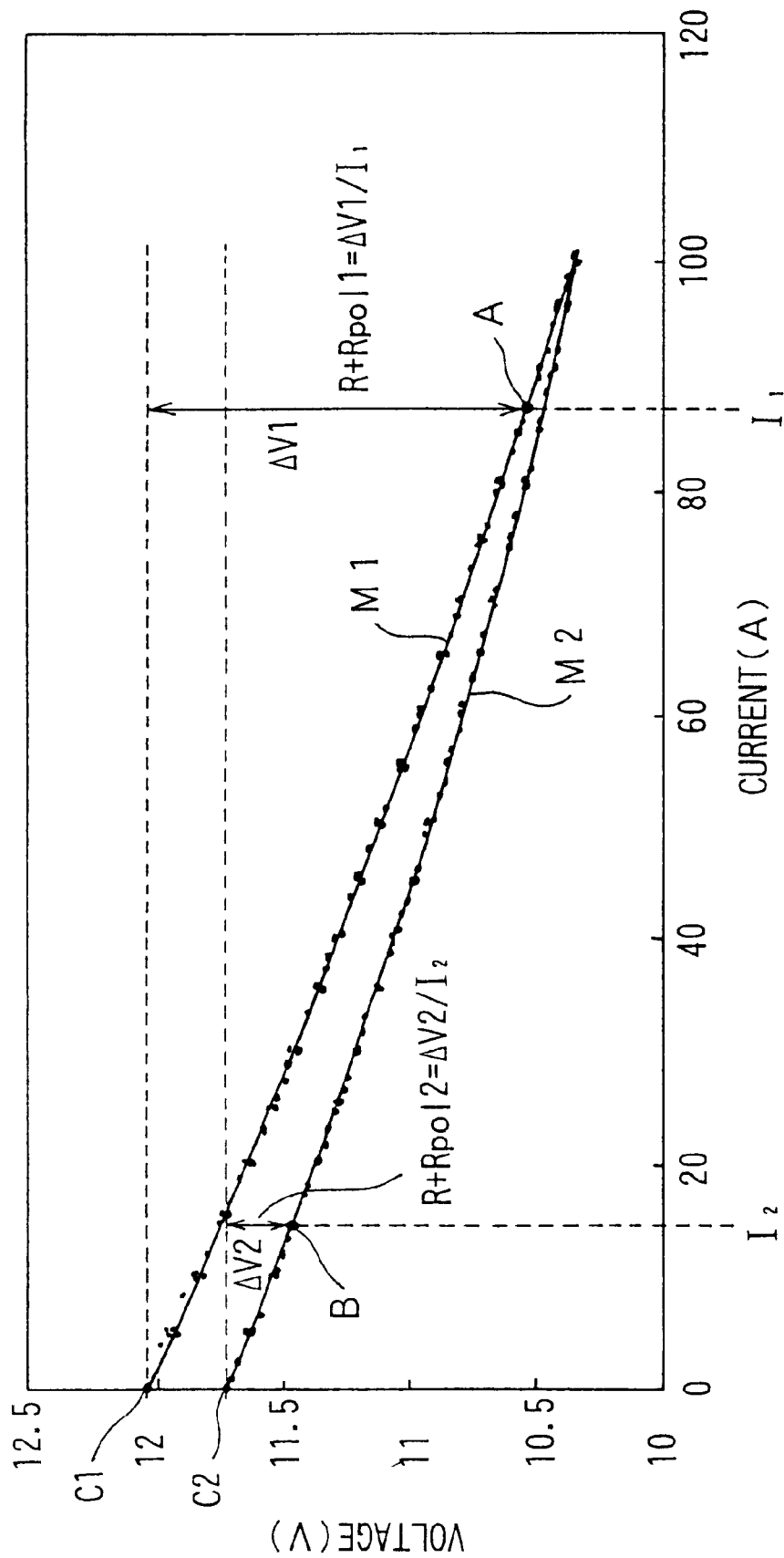
FIG. 7 is a graph for explaining the method for defining two optional points on the two approximate characteristic curves.

Likewise, as seen from the graph of FIG. 7, point B is set within a range of the real data on the approximate curve represented by M2. A voltage drop $\Delta V1$ from intercept C2 of the approximate curve M2 for the ordinate of the graph of FIG. 7 is acquired. The value when the $\Delta V2$ is divided by the current I2 at point B is a combined resistance that is a sum of the pure resistance R and the polarization resistance component Rpol 2. Namely, $$R+Rpol\ 2=\Delta V2/I1$$

The difference $\Delta R$ between the combined resistances at points A and B is represented by $$\Delta R=R+Rpol\ 1-(R+Rpol\ 2)=Rpol\ 1-Rpol\ 2$$

This value represents a difference in the polarization resistance at points A and B. Therefore, it is apparent that the pure resistance R during the discharging does not vary.

Figure 8:
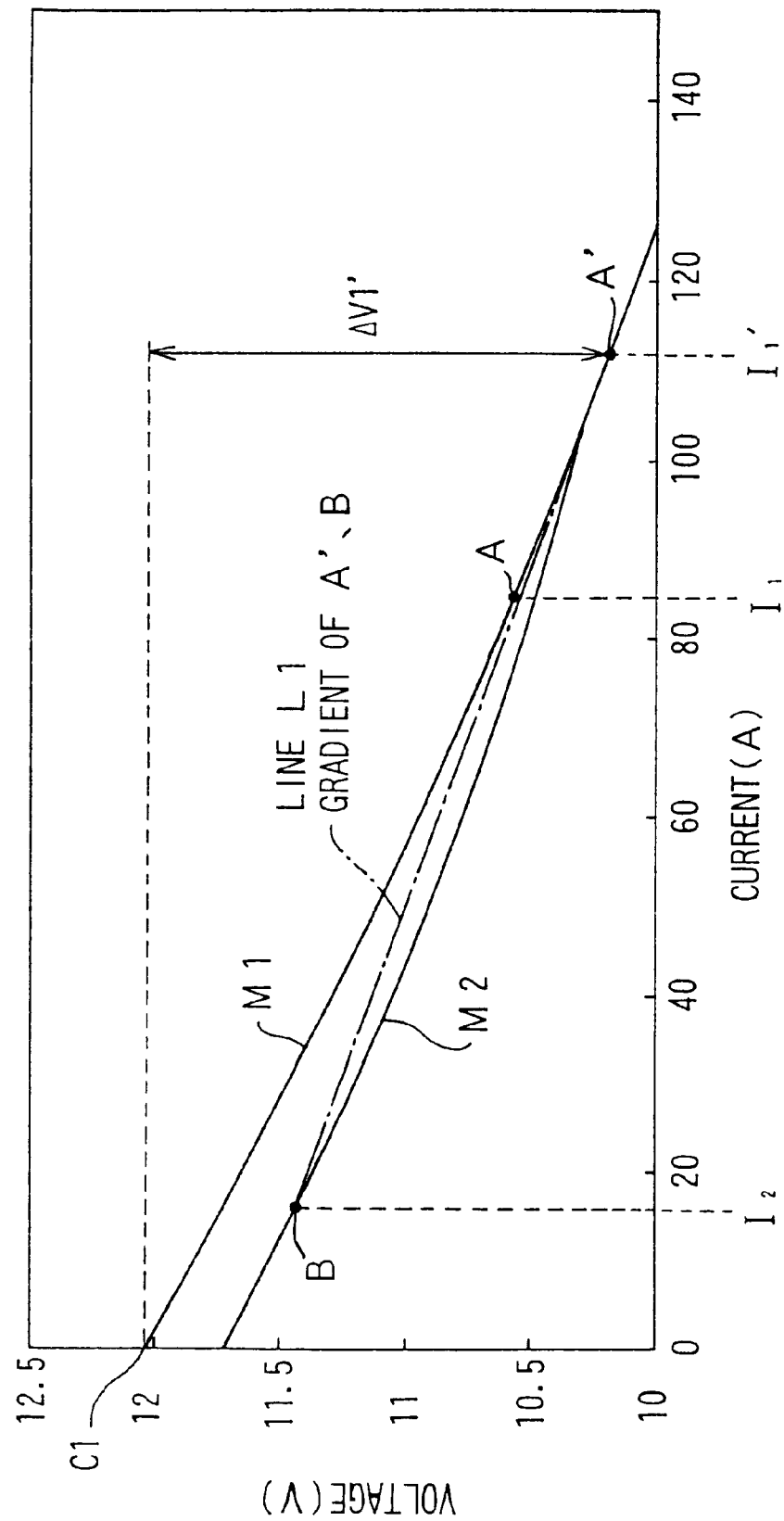
FIG. 8 is a graph for explaining the manner for defining an assumed point on the one approximate characteristic curve and the manner for correcting the gradient between two points.

Incidentally, as shown in FIG. 8, point A' with a value (R+Rpol1') equal to the synthesized resistance (R+Rpol2) at point B selected on the approximate curve M2 is located on the approximate curve M1. Further, as shown in FIG. 9, point B' with a value (R+Rpol2') equal to the synthesized resistance at point A selected on the approximate curve M1 is located on the approximate curve M2. Namely, point A' where R+Rpol1' =R+Rpol2 is located on the approximate curve M1, whereas point B' where R+Rpol1=R+Rpol2' is located on the approximate curve M2.

In short, assuming that the current and voltage at point A' are I1' and V1', and that the current and voltage at point B' are I2' and V2', the polarization resistances at the coordinate (I', V1') of point A' and the coordinate (I2, V2) of point B are equal to each other, and the polarization resistances at the coordinate (I1, V1) of point A and the coordinate (I2', V2')at point B' are equal to each other.

An explanation will be given of the manner of computing the current I1' and voltage V1' at point A' with the resistance equal to the synthesized resistance (R+Rpol2) at point B which is used as a standard.

The voltage drop $\Delta V1'$ from intercept C1 of the approximate curve M1 for the ordinate to point A' can be expressed by $$\Delta V1'=C1-(a1I1'^2+b1I1'+C1)=(R+Rpol2)I1'$$

Therefore, $$-(a1I1'+b1)=R+Rpol2$$

Thus, the current I1' at point A' is expressed by $$I1'=-(b1+R+Rpol2)/a1$$

Since R+Rpol2 (=R+pol1')=$\Delta V2/I2$ (=$\Delta V1'/I1'$), $$I1' = -[b1 + (\Delta V2/I2)]/a1$$
$$= -[b1 + (\Delta V1'/I1')]/a1$$

As apparent from the above equation, the voltage V1' at point A' is expressed by $$V1'=a1I1'^2+b1I1'+C1$$

Thus, the coordinate (I1'+V1') of point A' is computed by known values.

Likewise, the current I2' and voltage V2' at point B' equal to that (R+Rpol1) at point A are expressed by $$I2' = -[b2 + (\Delta V2/I2)]/a2$$
$$= -[b2 + (VI'/II')]/a2$$

$$V2'=a2I2'^2+b2I2'+C2$$

Thus, the coordinate (I1', V2') can be computed by known values.

$\Delta V2'$ represents the voltage drop from intercept C2 of approximate curve M2 for the ordinate crosses the ordinate.

Thereafter, as seen from FIG. 8, the gradient of a line L1 connecting the coordinate (I1', V1') of point A' and the coordinate (I2, V2) is acquired to provide the synthesized resistance R1. The synthesized resistance R1 is acquired by dividing the voltage drop (V1'−V2) due to the synthesized resistance (composed of the pure resistance and the polarization resistance Rpol2) by current difference (II'-I2). Namely, $$R1=(V1'-V2)/(I1'-I2)$$

Figure 9:
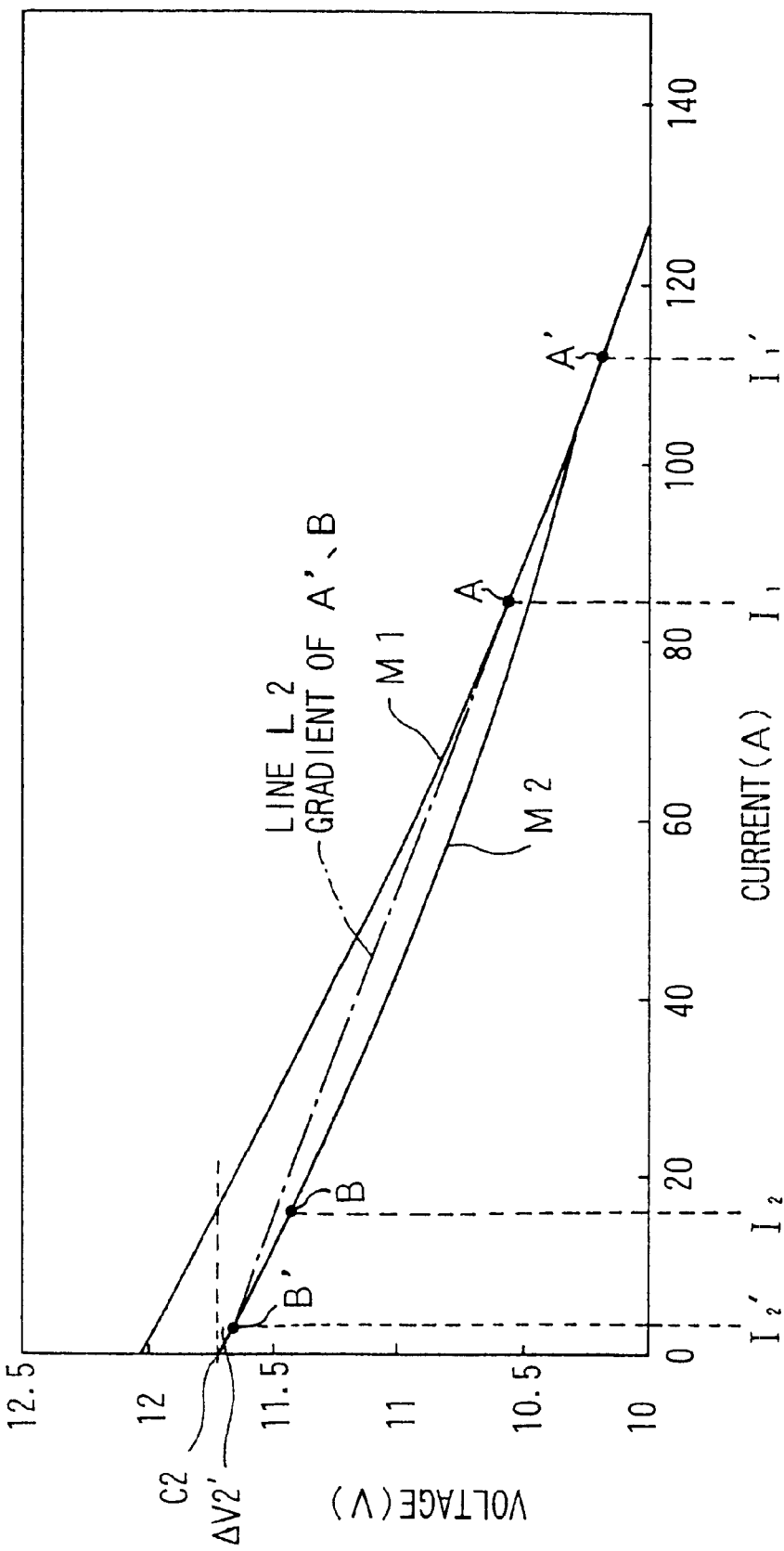
FIG. 9 is a graph for explaining the manner for defining an assuming point for the other approximate characteristic curve and the manner for correcting the gradient between two points.

Likewise, as seen from FIG. 9, the gradient of a line L2 connecting the coordinate (I2', V2') of point B' and the coordinate (I1, V1) is acquired to provide the synthesized resistance R1. The synthesized resistance R2 is acquired by dividing the voltage drop (V1'−V2) due to the synthesized resistance (composed of the pure resistance and the polarization resistance Rpol1) by current difference (I1-I2'). Namely, $$R2=(V1-V2')/(I1-I2')$$

However, the synthesized resistances R1 and R2 are not coincident to pure resistances. This inconvenience can be overcome by dividing the voltage drop exclusive of that due to the polarization resistance.

With reference to point B, assuming that the synthesized resistance R1 is expressed by $$R1=R1'+Rpol2=R1'+Rpol1',$$

the voltage drop produced when the current corresponding to a difference between the current I1' at point A' and the I2 at point B flows through the resistance R1' should be incrementally compensated for, at the voltage at point A', by the voltage drop produced when a current corresponding to a difference between the current I1' at point A' and the current I2 at point B flows through the polarization resistance Rpol1' (or Rpol2), and hence the following equation holds.

$$R1'(I1'-I2)=[V1'+Rpol1'(I1'-I2)]-V2$$

Hence, $$R1'(I1'-I2)=(V1'-V2)+Rpol1'(I1'-I2)$$

Now, since $$Rpol1'=\Delta V1'/I1'-R1'R1'(I1'-I2)=(V1'-V2)+(\Delta V1'/I1'-R1')(I1'-I2)$$
$$2R1'(I1'-I2)=(V1'-V2)+\Delta V1'/I1'(I1'-I2)$$

As a result, $$R1'=[(V1'-V2)+(\Delta V1'/I1')(I1'-I2)]/2(I1'-I2)$$

Incidentally, it should be noted that $(\Delta V1'/I1')$ can be replaced by $(\Delta V2/I2)$.

Likewise, with reference to point A, assuming that the synthesized resistance R2 is expressed by $$R2=R2'+Rpol1=R2'+Rpol2',$$

the voltage drop produced when the current corresponding to a difference between the current I1 at point A and the I2' at point B' flows through the resistance R2' should be detrimentally compensated for, at the voltage at point B', by the voltage drop produced when a current corresponding to a difference between the current I1 at point A and the current I2' at point B' flows through the polarization resistance Rpol2' (or Rpol1), and hence the following equation holds.

$$R2'(I1-I2')=V1-[V2'-Rpol2'(I1-I2')]$$

Hence, $$R2'(I1-I2')=(V1-V2')+Rpol2'(I1-I2')$$

Now, since $$Rpol2'=\Delta V2'/I2'-R2'R2'(I1-I2')=(V1-V2')+(\Delta V2'/I2'-R2')(I1-I2)$$
$$2R2'(I1-I2')=(V1-V2')+\Delta V12/I2'(I1'-I2')$$

As a result, $$R2'=[(V1-V2')+(\Delta V2'/I2')(I1-I2')]/2(I1-I2')$$

Incidentally, it should be noted that $(\Delta V2'/I2')$ can be replaced by $(\Delta V1/I1)$.

The two resistances R1' and R2' have been acquired with reference to the two points A and B using the different polarization resistances (Rpol1'=Rpol2) and (Rpol1=Rpol2') and voltage drops $\Delta V1'(\Delta V1)$ and $\Delta V2'(\Delta V2)$ from the different intercepts C1 and C2, and hence cannot be pure resistances. Thus, by obtaining the weighted average of both resistances, $$R=(R1'+R2')/2$$

the real pure resistance R can be acquired.

Now referring to FIGS. 7 to 9, an explanation will be given of a method for measuring the pure resistance of an in-vehicle battery. When the load requiring a large current, such as a starter motor, motor generator, running motor, etc. a discharging current which increases monotonously to exceed a prescribed value and decreases monotonously from a maximum value to the prescribed value or lower. In the meantime, the terminal voltage of the battery and discharging current are periodically sampled at intervals of 1 ms. Thus, a large number of sets of the terminal voltage of the battery and the discharging current can be acquired.

The newer sets of the terminal voltages and the discharging currents for a prescribed time are stored for collection in a memory such as an RAM serving as a rewritable storage means. Using the sets of terminal voltages and the discharging currents thus collected, two approximate curves M1 and M2 which show the relationship between the terminal voltage and the discharging current are obtained by the least squares method. They are the first approximate curve M1 which shows a change of the voltage for an increasing discharging current, represented by a quadratic equation: $V1(I)=a1I^2+b1+C1$ and the second approximate curve M2 which shows a change of the voltage for a decreasing discharging current, represented by a quadratic equation: $V2(I)=a2I^2+b2I+C2$.

The first point A and the second point B are set on the first approximate curve M1 and the second approximate curve M2, respectively. In this case, points A and B are preferably set within a range where real data of the terminal voltage and the discharging current used to acquire the approximate curves reside. In this way, the corresponding points will not be assumed at points largely separate from the set points. The first point A and the second point B are preferably set on both sides of point which provides a maximum point with maximum polarization resistance. Thus, the assumed points are set on both sides of the maximum point so that the accuracy of the pure resistance acquired later can be enhanced.

The first assumed point A' is assumed on the first approximate curve M1, and the second assumed B' is assumed on the second approximate curve M2. As described previously, the first assumed point A' provides the same resistance as the second synthesized resistance R2 composed of the pure resistance of the battery and the second polarization resistance component Rpol2, which produces the second voltage drop $\Delta V2$ when the second discharging current I2 corresponding to the second point B flows. The second assumed point B' provides the same resistance as the first synthesized resistance R1 composed of the pure resistance of the battery and the first polarization resistance component Rpol1, which produces the first voltage drop $\Delta V1$ when the first discharging current I1 corresponding to the first point A flows.

When the two assumed points A' and B' could be assumed appropriately, the first gradient R1 of the line L1 connecting the second point B and the first assumed point A1 is corrected by the voltage drop Rpol2(I1'-I2) due to the second polarization resistance component Rpol2, which are produced by the second discharging current I2 and the discharging current I1' at the first assumed point A', thereby providing the first corrected gradient R1' exclusive of the voltage drop due to the second polarization resistance component Rpol2. Likewise, the second gradient R2 of the line L2 connecting the first point A and the second assumed point B' is corrected by the voltage drop Rpol2(I1-I2') due to the first polarization resistance component Rpol2, which are produced by the first discharging current I1 and the discharging current I2' at the second assumed point B', thereby providing the second corrected gradient R2' exclusive of the voltage drop due to the first polarization resistance component Rpol1.

The first corrected gradient R1' and the second corrected gradient R2 are summed and the sum is averaged to provide an average gradient. The average gradient thus provided is measured as a pure resistance of the battery.

Referring to the drawings, an explanation will be given of an apparatus for implementing the method for measuring the pure resistance of an in-vehicle battery.

Figure 2:
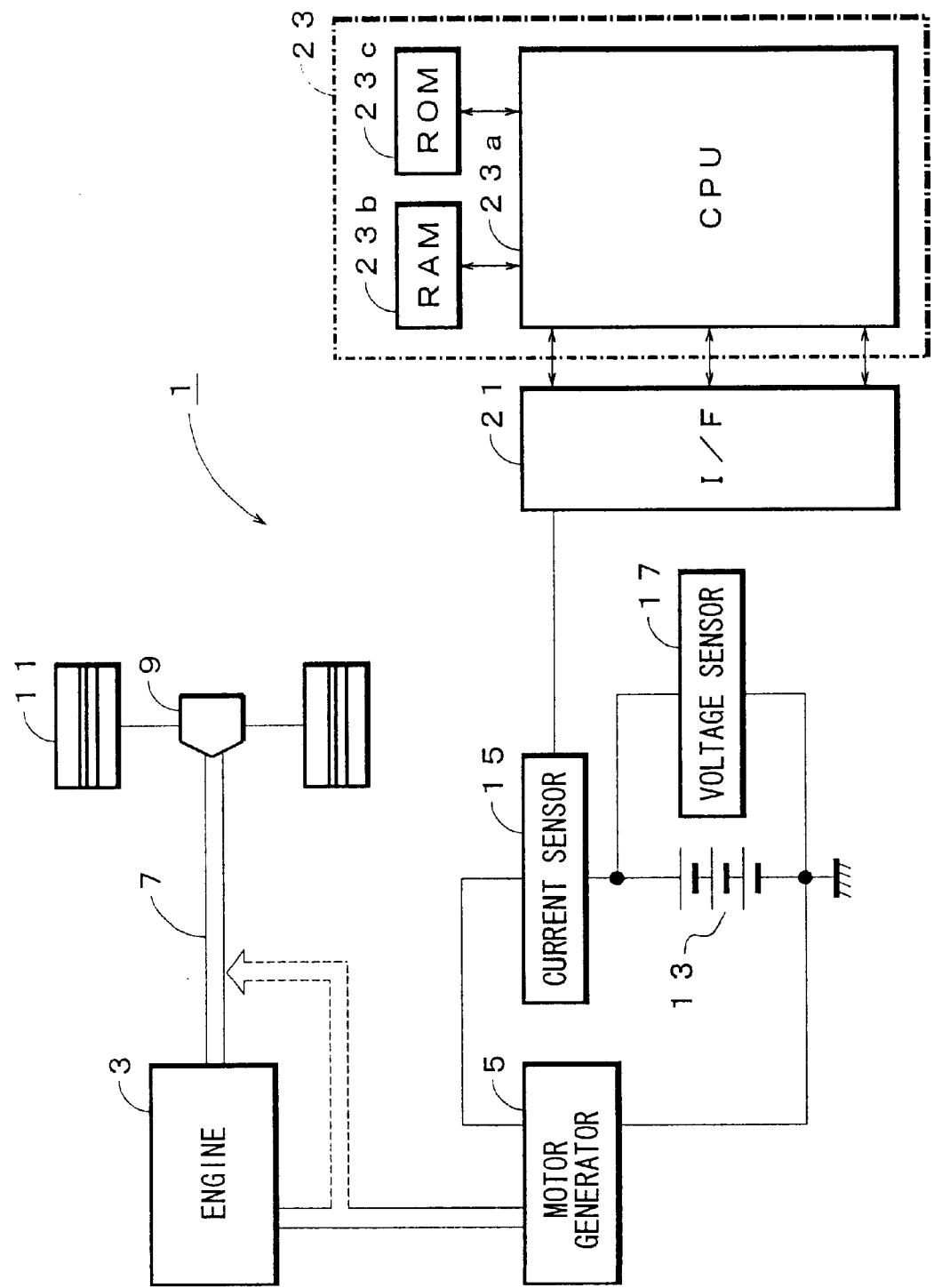
FIG. 2 is a schematic block diagram of an apparatus for measuring the pure resistance of an in-vehicle battery to which a method for measuring the pure resistance according to the first embodiment of this invention is applied.

FIG. 2 is a view for explaining partially in block form the schematic configuration of an apparatus for measuring the pure resistance of an in-vehicle battery according to this invention. In FIG. 2, the apparatus is loaded in a hybrid vehicle provided with a motor generator 5 as well as an engine 3.

During a normal operation, this hybrid vehicle is traveled in such a manner that only the output from the engine 3 is transmitted from a drive shaft 7 to a wheel 11 through a differential case 9. Under high load, the hybrid vehicle is assist-traveled in such a manner that a motor generator 5 is functioned as a motor by the power from a battery 13 so that the output from the motor generator 5 as well as the output from the engine 3 is transmitted from the drive shaft 7 to the wheel 11.

Further, in the hybrid vehicle, during deceleration or braking, the motor generator 5 is functioned as a generator so that kinetic energy is converted into electric energy to charge the battery 13.

The motor generator 5 is used as a cell motor for forcibly rotating the flywheel of the engine 3 when the engine starts by turn-on of a starter switch (not shown). In this time, a large current is passed through the motor generator 5 in a short time. After the engine 3 has been started by the motor generator 5, the starter switch is turned off by release of an ignition key (not shown) so that the ignition switch or an accessory switch is shifted into an ON state. Thus, the discharging current from the battery 13 is shifted into a stationary current.

Meanwhile, the apparatus for measuring the pure resistance of the battery is provided with a current sensor 15 for detecting the discharging current from the battery 13 for the electric equipment such as the motor generator 5 when it serves as a cell motor for assist traveling or cell motor and the charging current from the motor generator 5 when it serves as a generator, and a voltage sensor 17 for detecting the terminal voltage of the battery 13.

The pure resistance measuring apparatus 1 is further provided with a microcomputer 23 to which the outputs from the current sensor 15 and voltage sensor 17 are fed after they have been A/D converted by an interface (I/F) 21.

The microcomputer 23 includes a CPU 23a, RAM 23b and ROM 23c. The interface 21 as well as the RAM 23b and ROM 23c is connected to the CPU 23a. The switches for the electric equipment other than the starter switch, ignition switch, accessory switch and motor generator 5 are also connected to the CPU 23a.

The RAM 23b contains a data area for storing various kinds of data and a work area of various kinds of processing. The ROM 23c stores a control program for performing various kinds of processing.

Incidentally, the current values and voltage values which are outputs from the current sensor 15 and voltage sensor 17 are sampled at a high speed at short intervals. The sampled values are captured into the CPU 23a of the microcomputer 23. The captured current values and voltage values which are newer for a prescribed period are stored in the data area (corresponding to the storage means) of the RAM 23b. These real data are used to acquire the quadratic approximate curve which represents the voltage-current characteristic of the battery.

Now referring to FIG. 10, an explanation will be given of the processing which is performed by the CPU 23a according to the control program stored in the ROM 23c.

The microcomputer starts by power supply from the battery 13. Then, the program starts so that the CPU 23a executes initialization (step S1).

The CPU 23a executes real data collecting processing. Specifically, the CPU 23a reads, through the interface 21, the pair of the A/D converted values of the discharging current I from the battery 13 detected by the current sensor 15 and the terminal voltage V of the battery 13 detected by the voltage sensor 17, and store the read real data which are new for a prescribed period in the data area of the RAM 23b (Step S2). It should be noted that the real data collecting processing in step S2 is always continuously executed.

The newer data of the discharging current I and terminal voltage for the prescribed period are analyzed to decide whether or not they are suitable to acquire the quadratic approximate curve of the voltage-current characteristic. Namely, the CPU 23a executes the analyzing processing on whether or not the discharging current, which increases monotonously to exceed a prescribed value and decreases monotonously from the maximum value to the prescribed value or lower, flows (step S3 and step S4).

If the answer is YES in step S4 (the data suitable to acquire the quadratic approximate curve of the voltage-current characteristic have been collected), the CPU 23a executes approximate curve computing processing (step S5). Specifically, the CPU 23a acquires the first approximate curve M1 which shows a change of the voltage for an increasing discharging current, represented by a quadratic: $V1(I)=a1I^2+b1+C1$ and the second approximate curve M2 which shows a change of the voltage for a decreasing discharging current, represented by a quadratic: $V2(I)=a2I^2+b2I+C2$.

If the answer is "NO" in step S4, the processing returns to step S2.

Further, the CPU 23a executes computing processing for acquiring the pure resistance of the battery (step S6). Specifically, the first assumed point is assumed on the voltage-current characteristic curve represented by the first approximate curve M1. The second assumed point is assumed on the voltage-current characteristic curve represented by the second approximate curve M2. The first assumed point has the resistance equal to the synthesized resistance composed of the pure resistance and the first polarization resistance component, which generates the voltage drop when the discharging current corresponding to a certain point on the voltage-current characteristic curve of the approximate curve M1. Likewise, the second assumed point has the resistance equal to the synthesized resistance composed of the pure resistance and the second polarization resistance component, which generates the voltage drop when the discharging current corresponding to a certain point on the voltage-current characteristic curve of the approximate curve M2.

In the computing processing in step S6, the first gradient of the line connecting point defined on the second approximate curve M2 and the above first assumed point is corrected by the difference between the voltage drops due to the second polarization resistance component, which are produced by the discharging current at point on the second approximate curve M2 and the discharging current at the first assumed point, thereby providing the first corrected gradient exclusive of the voltage drop due to the second polarization resistance component.

Likewise, the second gradient of the line connecting point defined on the first approximate curve M1 and the above second assumed point is corrected by the difference between the voltage drops due to the first polarization resistance component, which are produced by the discharging current at point on the first approximate curve M1 and the discharging current at the second assumed point, thereby providing the second corrected gradient exclusive of the voltage drop due to the first polarization resistance component.

In step S7, the first corrected gradient and the second corrected gradient are summed and the sum is averaged to provide an average gradient. The average gradient thus provided is measured as a pure resistance of the battery. The measured pure resistance is stored in the data area of the RAM 23b for use in various purposes. Thereafter, the processing returns to step S2. The processing from step S2 to S7 is repeated.

Incidentally, step S2 is defined as the processing for the voltage/current measuring means in claims, step S5 is defined as the processing for the approximate curve computing means and step S6 is defined as the processing for the operating means.

An explanation will be given of the operation (function) of the apparatus for measuring the pure resistance in the in-vehicle battery, having the configuration described above.

While the electric equipment (load) other than the motor generator 5 of the hybrid vehicle operates or the motor generator 5 functions as a motor, and hence the battery 13 is discharging, when a discharging current, which increases monotonously to exceed a prescribed value and decreases monotonously from the maximum value to the prescribed value or lower, flows through the load, the terminal voltage and discharging current are measured periodically.

The data of the terminal voltage V and the discharging current I thus measured which are newer for a prescribed period are stored in the data area of the RAM 23b. Such real data are decided on whether they are suitable to acquire the quadratic approximate curve of the voltage-current characteristic using the least-squares method. Namely, it is analyzed whether or not the discharging current, which increases monotonously to exceed a prescribed value and decreases monotonously from the maximum value to the prescribed value or lower, flows.

Therefore, the processing of computing the approximate curve will not be carried out until the data suitable to acquire the quadratic approximate curve can be obtained and also the computing processing may be carried out using the read data previously collected for the predetermined time. It is not required that the computing processing is performed synchronously with the periodic measurement of the discharging current and the terminal voltage. Namely, the high processing speed is not required.

In the apparatus for measuring the pure resistance of the battery according to this embodiment, two points are set within the range where there are the terminal voltage and discharging current of the battery measured to acquire the first approximate curve and the second approximate curve. Although such a measure is not required as long as the necessary accuracy is satisfied, these points are preferably set within the range where the first approximate curve increases monotonously or the second approximate curve decreases monotonously.

Figure 11:
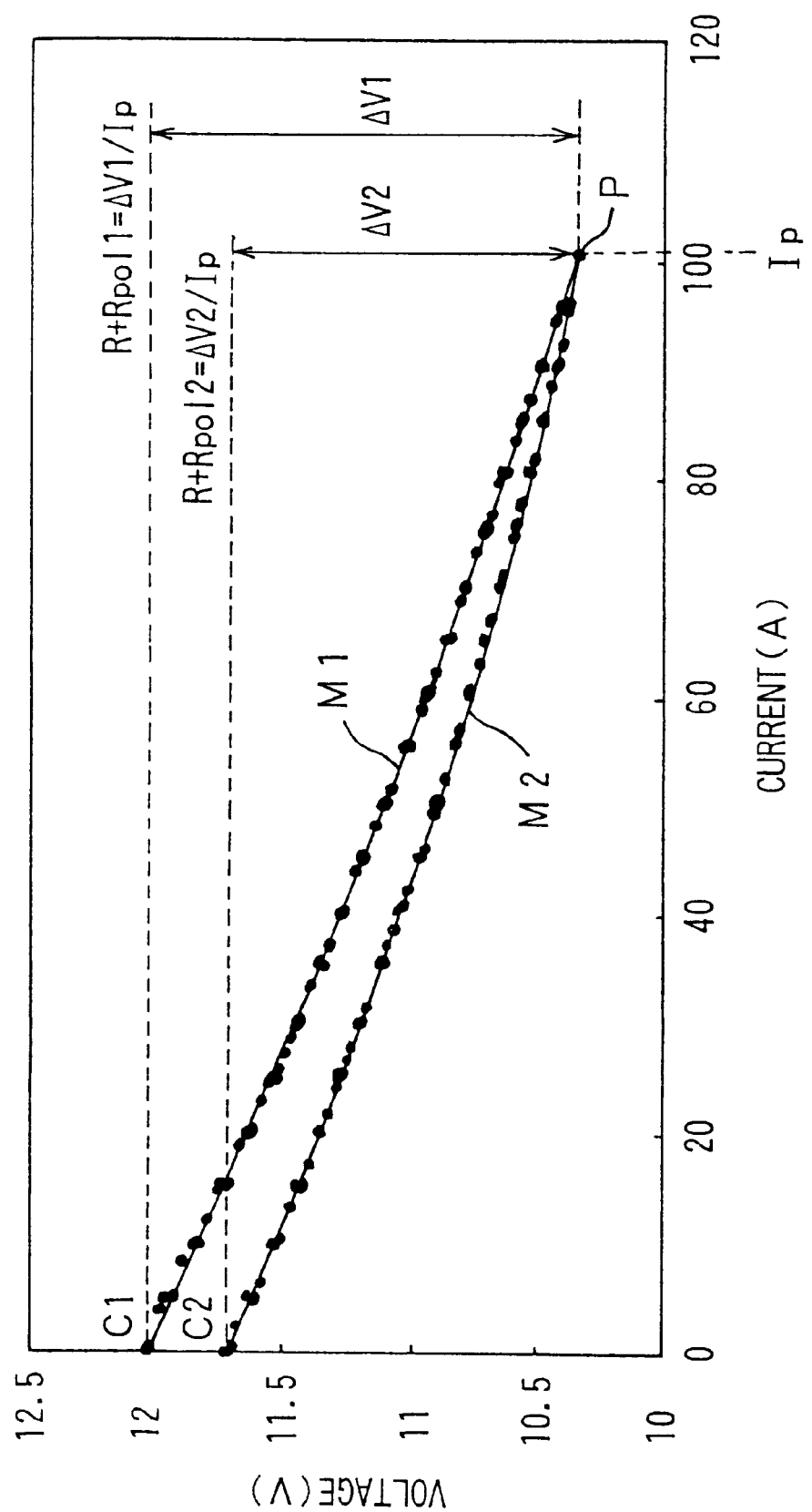
FIG. 11 is a graph for explaining the manner of defining two points on two approximate characteristic curves in the second embodiment of this invention.
Figure 12:
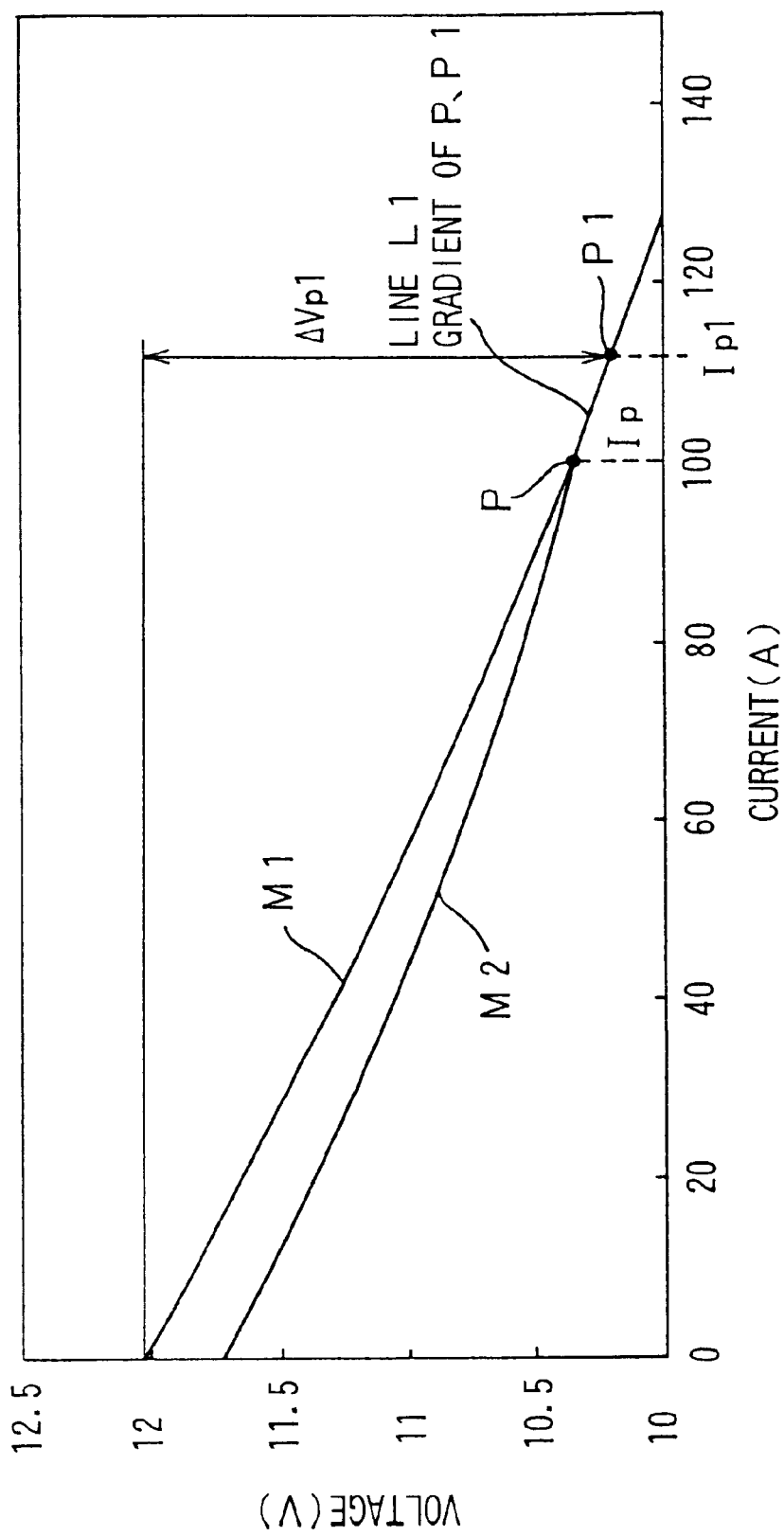
FIG. 12 is a graph for explaining the manner for defining an assumed point for the one approximate characteristic curve and the manner for correcting the gradient between two points in the second embodiment.
Figure 13:
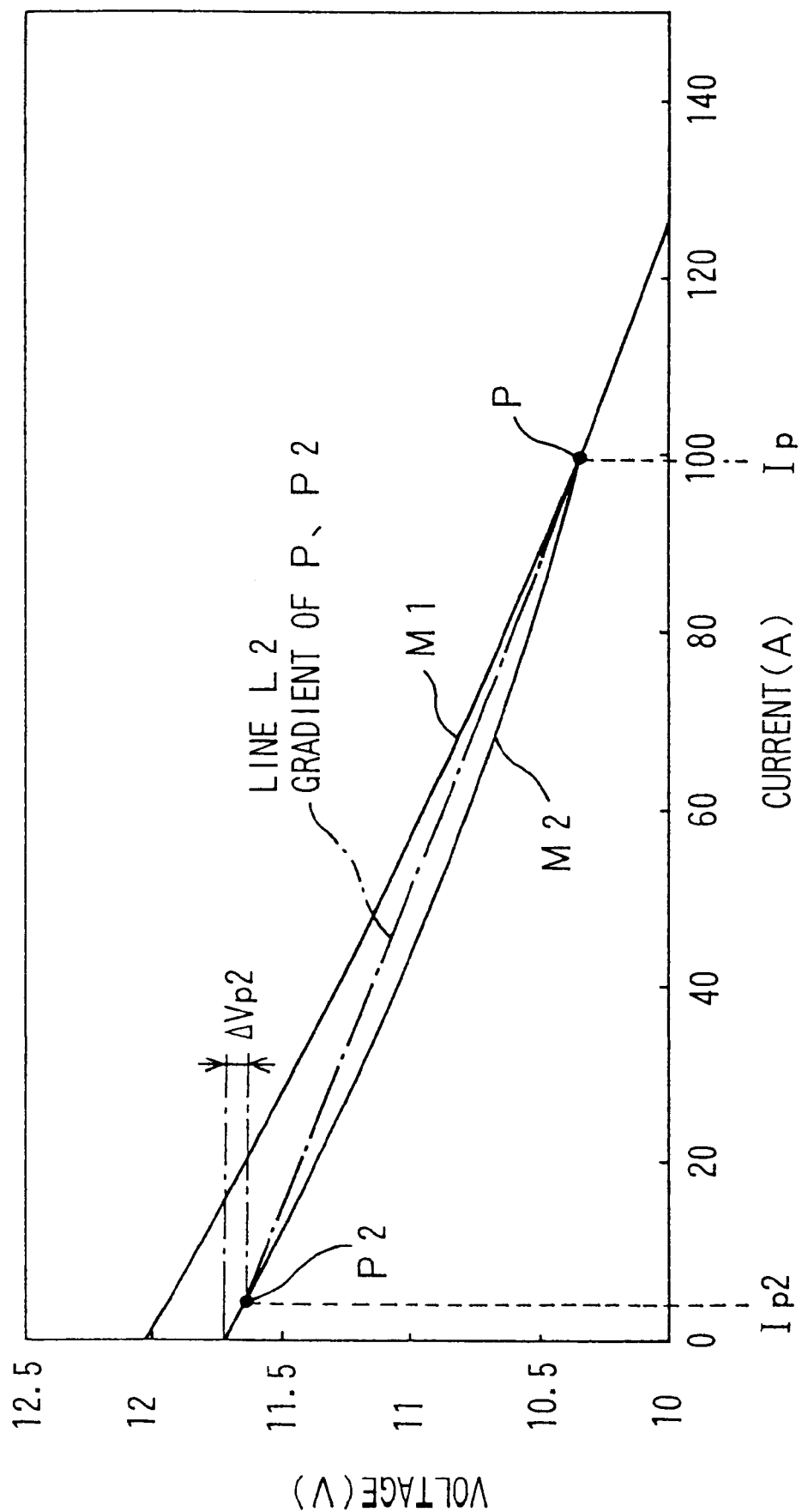
FIG. 13 is a graph for explaining the manner for defining an assumed point for the other approximate characteristic curve and the manner for correcting the gradient between two points in the second embodiment.

In the embodiment described above, the two optional points A and B are set within the range where there are the real data of the approximate curves M1 and M2. However, as a modification thereof, a single point may be set at point P corresponding to the maximum discharging current of the battery, which is measured to acquire the two approximate curves M1 and M2. Using the common data, inclusion of an error can be suppressed. Referring to FIGS. 11 to 13, an explanation will be given of this modification.

First, a point P corresponding to the maximum value of the discharging current of the battery is set on the two approximate curves M1 and M2. A voltage drop $\Delta V1$ from the intercept C1 of the ordinate in the approximate curve M1 to point P on the approximate curves is acquired. The value when the $\Delta V1$ is divided by the current Ip at point P is a combined resistance that is a sum of the pure resistance R and the polarization resistance component Rpol 1. Namely, $$R + Rpol1 = \Delta V1/Ip$$

Likewise, a voltage drop $\Delta V2$ from an intercept C2 of the ordinate of the approximate curve M2 to point P on the approximate curves is acquired. The value when the $\Delta V2$ is divided by the current Ip at point P is a combined resistance that is a sum of the pure resistance R and the polarization resistance component Rpol 2. Namely, $$R + Rpol2 = \Delta V2/Ip$$

The difference $\Delta R$ between the combined resistances at point P is represented by $$\Delta R = R + Rpol1 - (R + Rpol2) = Rpol1 - Rpol2$$

This value represents a difference in the polarization resistance at point P of the different approximate curves. Therefore, it is apparent that the pure resistance R when the discharging has occurred once does not vary.

Incidentally, as shown in FIG. 12, point P1 with a value (R+Rpol1') equal to the synthesized resistance (R+Rpol2) at point P set on the approximate curve M2 is located on the approximate curve M1. Further, as shown in FIG. 13, point P2 with a value (R+Rpol2') equal to the synthesized resistance at point P selected on the approximate curve M1 is located on the approximate curve M2. Namely, point P1 where R+Rpol1'=R+Rpol2 is located on the approximate curve M1, whereas point P2 where R+Rpol1=R+Rpol2' is located on the approximate curve.

In short, assuming that the current and voltage at point P1 are Ip1 and Vp2, and that the current and voltage at point P2 are Ip2 and Vp2, the polarization resistances at the coordinate (Ip1, Vp1) of point P1 and the coordinate (Ip, Vp) of point P are equal to each other, and the polarization resistances at the coordinate (Ip, Vp) of point P and the coordinate (Ip2, Vp2) are equal to each other.

An explanation will be given of the manner of computing the current Ip1 and voltage Vp1 at point P1 with the resistance (R+Rpol1') equal to the synthesized resistance (R+Rpol2) at point P.

The voltage drop $\Delta Vp1$ from the intercept C1 where the approximate curve M1 crosses the ordinate to point P1 can be expressed by $$\Delta Vp1 = C1 - (a1Ip1^2 + b1Ip1 + C1) = (R + Rpol2)Ip1$$

Therefore, $$-(a1Ip1 + b1) = R + Rpol2$$

Thus, the current Ip1 at point P1 is expressed by $$Ip1 = -(b1 + R + Rpol2)/a1$$

Since $$R + Rpol2\ (= R + pol1') = \Delta V2/I2\ (= \Delta Vp1/Ip1),$$

$$Ip1 = -[b1 + (\Delta Vp/Ip)]/a1$$
$$= -[b1 + (Vp1/Ip1)]/a1$$

As apparent from the above equation, the voltage Vp1 at point P1 is expressed by $$Vp1 = a1Ip1^2 + b1Ip1 + C1$$

Thus, the coordinate (Ip1+Vp1) of point P1 is computed by known values.

Likewise, the current Ip2 and voltage Vp2 at point P2 with a value (R+Rpol2') equal to that (R+Rpol1) at point P are expressed by $$Ip2 = -[b2 + (\Delta V2/I2)]/a2$$
$$= -[b2 + (Vp2/Ip2)]/a2$$

Thus, the coordinate (Ip2, Vp2) can be computed by known values.

$\Delta Vp2$ represents the voltage drop from the intercept C2 where the approximate curve M2 crosses the ordinate.

Thereafter, as seen from FIG. 12, the gradient of a line L1 connecting the coordinate (Ip1, Vp1) of point P1 and the coordinate (Ip, Vp) is acquired to provide the synthesized resistance R1. The synthesized resistance R1 is acquired by dividing the voltage difference (Vp1−Vp) produced by the synthesized resistance (composed of the pure resistance and the polarization resistance Rpol2) by current difference (Ip1−Ip). Namely, $$R1=(Vp1-Vp)/(Ip1-Ip)$$

Likewise, as seen from FIG. 13, the gradient of a line L2 connecting the coordinate (Ip2, Vp2) of point P2 and the coordinate (Ip, Vp) is acquired to provide the synthesized resistance R1. The synthesized resistance R2 is acquired by dividing the voltage difference (Vp−Vp2) produced by the synthesized resistance (composed of the pure resistance and the polarization resistance Rpol1) by current difference (Ip−Ip2). Namely, $$R2=(Vp-Vp2)/(Ip-Ip2)$$

However, the synthesized resistances R1 and R2 are not coincident to pure resistances. This inconvenience can be overcome by dividing the voltage drop exclusive of that due to the polarization resistance.

With reference to point P of the approximate curve M2, assuming that the synthesized resistance R1 is expressed by $$R1=R1'+Rpol2=R1'+Rpol1',$$

the voltage drop produced when the current corresponding to a difference between the current Ip1 at point P1 and the Ip at point P flows through the resistance R1' should be incrementally compensated for, at the voltage at point P1, by the voltage drop produced when a current corresponding to a difference between the current Ip1 at point P1 and the current Ip at point P2 flows through the polarization resistance Rpol1'(or Rpol2), and hence the following equation holds.

$$R1'(I1'-I2)=[V1'+Rpol1'(I1'-I2)]-V2$$

Hence, $$R1'(I1'-I2)=(Vp1-Vp)+Rpol1'(Ip1-Ip)$$

Now, since $$Rpol1'=\Delta V1'/Ip1-R1'R1'(Ip1-Ip)=(Vp1-Vp)+(\Delta Vp1/Ip1-R1')(Ip1-I2)\ 2R1'(Ip1-I2)=(V1'-Vp)+\Delta Vp1/Ip1(Ip1-Ip)$$

As a result, $$R1'=[(Vp1-Vp)+(\Delta Vp1/Ip1)(I1-Ip)]/2(Ip1-Ip)$$

Incidentally, it should be noted that (ΔVp1/Ip1) can be replaced by (ΔV2/Ip).

Likewise, with reference to point P on the approximate curve M1, assuming that the synthesized resistance R2 is expressed by $$R2=R2'+Rpol1=R2'+Rpol2',$$

the voltage drop produced when the current corresponding to a difference between the current I1 at point A and the I2' at point B' flows through the resistance R2' should be detrimentally compensated for, at the voltage at point B', by the voltage drop produced when a current corresponding to a difference between the current I1 at point A and the current I2' at point B' flows through the polarization resistance Rpol2' (or Rpol1), and hence the following equation holds.

$$R2'(Ip-Ip2)=Vp-[Vp2-Rpol2'(Ip-Ip2)]$$

Hence, $$R2'(I1-Ip2)=(Vp-Vp2)+Rpol2'(Ip-Ip2)$$

Now, since $$Rpol2'=\Delta Vp2/Ip2-R2'R2'(Ip-Ip2)=(Vp-Vp2)+(\Delta Vp2/Ip2-Rp2)(Ip-Ip2)2R2'(I1-Ip2)=(Vp-Vp2)+\Delta Vp2/Ip2(Ip-Ip2)$$

As a result, $$R2'=[(V-Vp2)+(\Delta Vp2/Ip2)(Ip-Ip2)]/2(Ip-Ip2)$$

Incidentally, it should be noted that (ΔVp/Ip) can be replaced by (ΔV1/I1).

The two resistances R1' and R2' have been acquired with reference to the two points A and B using the different polarization resistances (Rpol1'=Rpol2) and (Rpol1=Rpol2') and voltage drops ΔVpl(ΔVp) and ΔVp2(ΔVp) from the different intercepts C1 and C2, and hence cannot be pure resistances. Thus, by obtaining the weighted average of both resistances, $$R=(R1'+R2')/2$$

the real pure resistance R can be acquired.

In the method explained with reference to FIGS. 11 to 13, the single point may be set at point P corresponding to the maximum discharging current of the battery, which is measured to acquire the two approximate curves M1 and M2. Using the common data, inclusion of an error can be suppressed.

The first assumed point P1 is assumed on the first approximate curve M1, and the second assumed P2 is assumed on the second approximate curve M2. As described previously, the first assumed point P1 provides the same resistance as the second synthesized resistance R2 composed of the pure resistance of the battery and the second polarization resistance component Rpol2, which produces the second voltage drop ΔV2 when the discharging current Ip corresponding to point P on the second approximate curve M2 flows. The second assumed point P2 provides the same resistance as the first synthesized resistance R1 composed of the pure resistance of the battery and the first polarization resistance component Rpol1, which produces the first voltage drop ΔV1 when the second discharging current Ip corresponding to point on the first approximate curve M1 flows.

When the two assumed points P1 and P2 could be assumed appropriately, the first gradient R1 of the line L1 connecting point P and the first assumed point P1 is corrected by the voltage drop Rpol2(Ip1−Ip) due to the second polarization resistance component Rpol2, which are produced by the discharging current Ip and the discharging current Ip1 at the first assumed point P1, thereby providing the first corrected gradient R1' exclusive of the voltage drop due to the second polarization resistance component Rpol2. Likewise, the second gradient R2 of the line L2 connecting point P and the second assumed point P2 is corrected by the voltage drop Rpol1(Ip−Ip2) due to the first polarization resistance component Rpol1, which are produced by the discharging current Ip and the discharging current Ip2 at the second assumed point P2, thereby providing the second corrected gradient R2' exclusive of the voltage drop due to the first polarization resistance component Rpol1.

The first corrected gradient R1' and the second corrected gradient R2' are summed and the sum is averaged to provide an average gradient. The average gradient thus provided is measured as a pure resistance of the battery.

Figure 10:
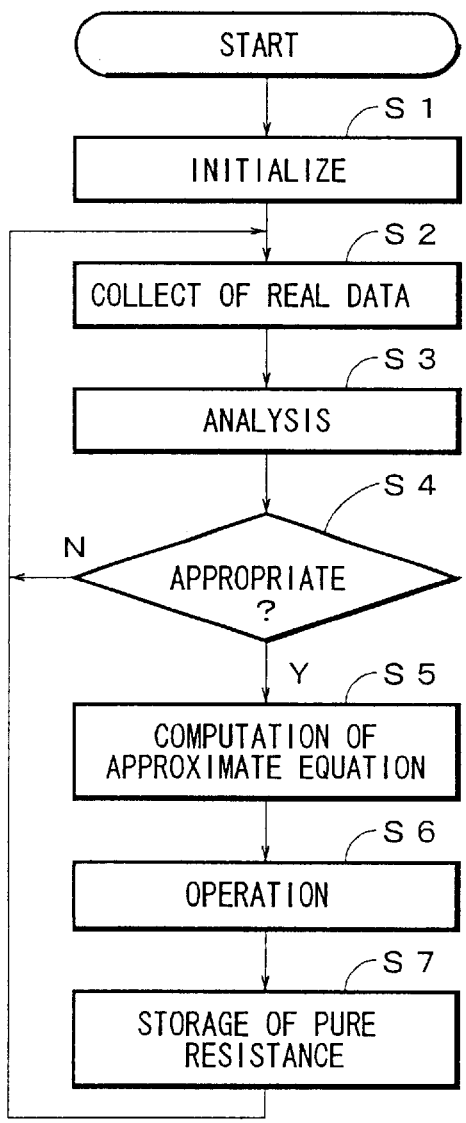
FIG. 10 is a flowchart showing the processing executed by a microcomputer in FIG. 2 in accordance with a predetermined program for measurement of a pure resistance.

This embodiment can be executed in substantially the same processing as illustrated in the flowchart of FIG. 10 with the first embodiment explained with reference to FIGS. 7 to 9, except that the two points on the approximate curves M1 and M2 are set at the same point corresponding to the maximum value of the discharging current of the battery on the two approximate curves M1 and M2.

What is claimed is:

1. A method for measuring a pure resistance of an in-vehicle battery which supplies electric power to a load of the vehicle comprising the steps of:

periodically measuring a terminal voltage and a discharging current of the in-vehicle battery when the discharging current, which increases monotonously to exceed a prescribed value and decreases monotonously from the maximum value to the prescribed value or lower, flows, thereby acquiring a first approximate equation of a voltage-current characteristic curve, indicative of correlation between the terminal voltage and the discharging current, for an increasing discharging current and a second approximate equation of the voltage-current characteristic for a decreasing discharging current;

setting a first point on the voltage-current characteristic curve represented by said first approximate equation and a second point on the voltage-current characteristic curve represent by said second approximate equation;

assuming a first assumed point and a second assumed point on the voltage-current curves represented by the first approximate equation and the second approximate equation, the first assumed point providing the same resistance as a second synthesized resistance composed of a pure resistance of the battery and a second polarization resistance component, which produces a second voltage drop when a second discharging current corresponding to said second point flows, and the second assumed point providing the same resistance as a first synthesized resistance composed of the pure resistance of the battery and a first polarization resistance component, which produces a first voltage drop when a first discharging current corresponding to said first point flows;

acquiring a first corrected gradient exclusive of a voltage drop due to the second polarization resistance component and a second corrected gradient exclusive of a voltage drop due to the first polarization resistance component, said first corrected gradient being acquired by correcting a first gradient of a first line connecting the second point and the first assumed point is corrected by a difference between the voltage drops due to the second polarization resistance component, which are produced by the second discharging current and the discharging current at the first assumed point, and said second corrected gradient being acquired by correcting a second gradient of a second line connecting the first point and the second assumed point by a difference between the voltage drops due to the first polarization resistance component, which are produced by the first discharging current and the discharging current at the second assumed point; and acquiring an average gradient of said first corrected gradient and said second corrected gradient by averaging a sum of them so that the average gradient is measured as the pure resistance of the battery.

2. A method for measuring a pure resistance of an in-vehicle battery according to claim 1, wherein said first point and said second point are located on the voltage-current characteristic curves represented by said first approximate equation and second approximate equation within a range where there are terminal voltage and the discharging current measured to acquire these equations.

3. A method for measuring a pure resistance of an in-vehicle battery according to claim 1, wherein said first point and said second point on the are located on the voltage-current characteristic curves represented by said first approximate equation and second approximate equation at a point corresponding to the maximum value of the discharging current of the battery measured to acquire these approximate equations.

4. A method for measuring a pure resistance of an in-vehicle battery according to claim 1, wherein said first approximate equation and said second approximate equation are quadratics.

5. A method for measuring a pure resistance of an in-vehicle battery according to claim 1, wherein newer sets of the terminal voltages and the discharging currents for a prescribed time are stored for collection in a memory.

6. An apparatus for measuring a pure resistance of an in-vehicle battery which supplies electric power to a load of the vehicle comprising:

means for periodically measuring a terminal voltage and a discharging current of the battery when the discharging current, which increases monotonously to exceed a prescribed value and decreases monotonously from the maximum value to the prescribed value or lower, flows;

means for acquiring a first approximate equation of a voltage-current characteristic curve, indicative of correlation between the terminal voltage and the discharging current, for the increasing discharging current and a second approximate equation of the voltage-current characteristic for the decreasing discharging current; and means for setting a first point on the voltage-current characteristic curve represented by said first approximate equation and a second point on the voltage-current characteristic curve represent by said second approximate equation, assuming a first assumed point and a second assumed point on the voltage-current curves represented by the first approximate equation and the second approximate equation, the first assumed point providing the same resistance as a second synthesized resistance composed of a pure resistance of the battery and a second polarization resistance component, which produces a second voltage drop when a second discharging current corresponding to said second point flows, and the second assumed point providing the same resistance as a first synthesized resistance composed of the pure resistance of the battery and a first polarization resistance component, which produces a first voltage drop when a first discharging current corresponding to said first point flows, acquiring a first corrected gradient exclusive of a voltage drop due to the second polarization resistance component and a second corrected gradient exclusive of a voltage drop due to the first polarization resistance component, said first corrected gradient being acquired by correcting a first gradient of a first line connecting the second point and the first assumed point is corrected by a difference between the voltage drops due to the second polarization resistance component, which are produced by the second discharging current and the discharging current at the first assumed point, and said second corrected gradient being acquired by correcting a second gradient of a second line connecting the first point and the second assumed point by a difference between the voltage drops due to the first polarization resistance component, which are produced by the first discharging current and the discharging current at the second assumed point, and acquiring an average gradient of said first corrected gradient and said second corrected gradient by averaging a sum of them so that the average gradient is measured as the pure resistance of the battery.

7. An apparatus for measuring a pure resistance of an in-vehicle battery according to claim 6, wherein said first point and said second point are located on the voltage-current characteristic curves represented by said first approximate equation and second approximate equation within a range where there are terminal voltage and the discharging current measured to acquire these equations.

8. An apparatus for measuring a pure resistance of an in-vehicle battery according to claim 6, wherein said first point and said second point on the are located on the voltage-current characteristic curves represented by said first approximate equation and second approximate equation at a point corresponding to the maximum value of the discharging current of the battery measured to acquire these approximate equations.

9. An apparatus for measuring a pure resistance of an in-vehicle battery according to claim 6, wherein said first approximate equation and said second approximate equation are quadratics.

10. A method for measuring a pure resistance of an in-vehicle battery according to claim 6, wherein newer sets of the terminal voltages and the discharging currents for a prescribed time are stored for collection in a memory.

* * * * *